(12) United States Patent
Allen, III

(10) Patent No.: US 6,629,309 B1
(45) Date of Patent: Sep. 30, 2003

(54) MASK-PROGRAMMABLE ROM CELL

(75) Inventor: Ernest Allen, III, Hillsboro, OR (US)

(73) Assignee: LSI Logic Corporation, Milpitas, CA (US)

( * ) Notice: Subject to any disclaimer, the term of this patent is extended or adjusted under 35 U.S.C. 154(b) by 216 days.

(21) Appl. No.: 09/894,643

(22) Filed: Jun. 27, 2001

(51) Int. Cl.$^7$ .............................................. G06F 17/50
(52) U.S. Cl. ................ 716/16; 365/185.18; 365/185.14
(58) Field of Search ................................ 257/269, 529; 714/773; 716/2, 5, 17, 19, 21; 356/185.18

(56) References Cited

U.S. PATENT DOCUMENTS

| | | | | |
|---|---|---|---|---|
| 3,641,516 A | * | 2/1972 | Castrucci et al. ............ | 257/529 |
| 5,412,599 A | * | 5/1995 | Daniele et al. ......... | 365/185.14 |
| 6,144,584 A | * | 11/2000 | Kunori et al. .......... | 365/185.18 |
| 6,222,216 B1 | * | 4/2001 | Rao et al. .................... | 257/296 |
| 6,260,172 B1 | * | 7/2001 | Hazama ...................... | 714/773 |

* cited by examiner

*Primary Examiner*—Matthew Smith
*Assistant Examiner*—Thuan Do
(74) *Attorney, Agent, or Firm*—Conley, Rose & Tayon

(57) ABSTRACT

A structure for programming a memory cell on an integrated circuit provides access at multiple mask levels of the integrated circuit to each of the programming voltages which may be used to program the memory cell. In an embodiment, the structure includes a conductive signal path extending through multiple horizontally conductive layers of the integrated circuit from a programming voltage pad (or node) to an input of the memory cell. The conductive signal path includes portions selected from multiple alternate path portions formed within the multiple horizontally conductive layers through which the signal path extends. An embodiment of a method for making a mask includes selecting one of multiple configurations of the programming structure portion to be formed using the mask. A computer-usable carrier medium may include digital representations of the alternative configurations for a programming structure portion from which a programming structure pattern may be selected.

35 Claims, 10 Drawing Sheets

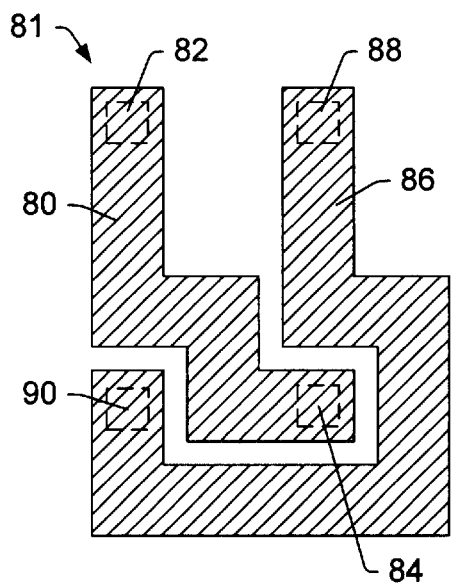
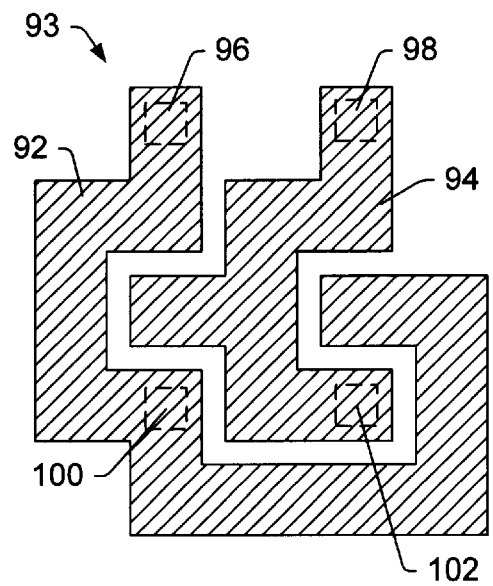
Fig. 3a
Fig. 3b
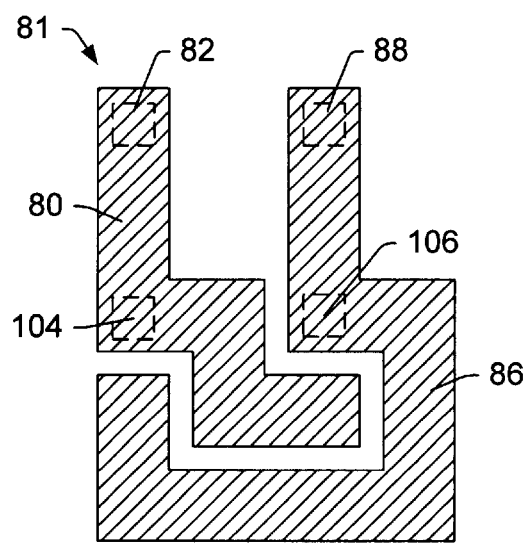
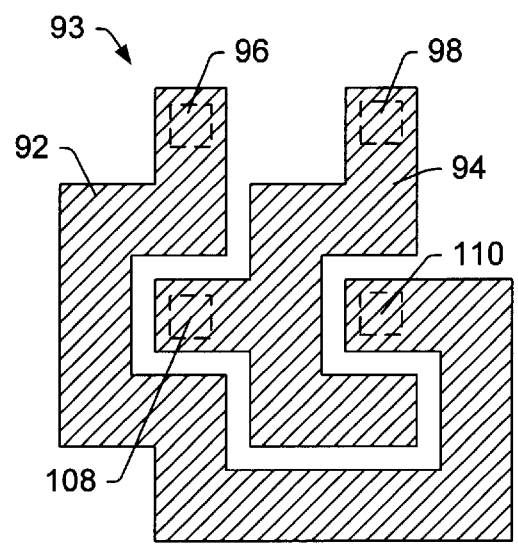
Fig. 4a
Fig. 4b

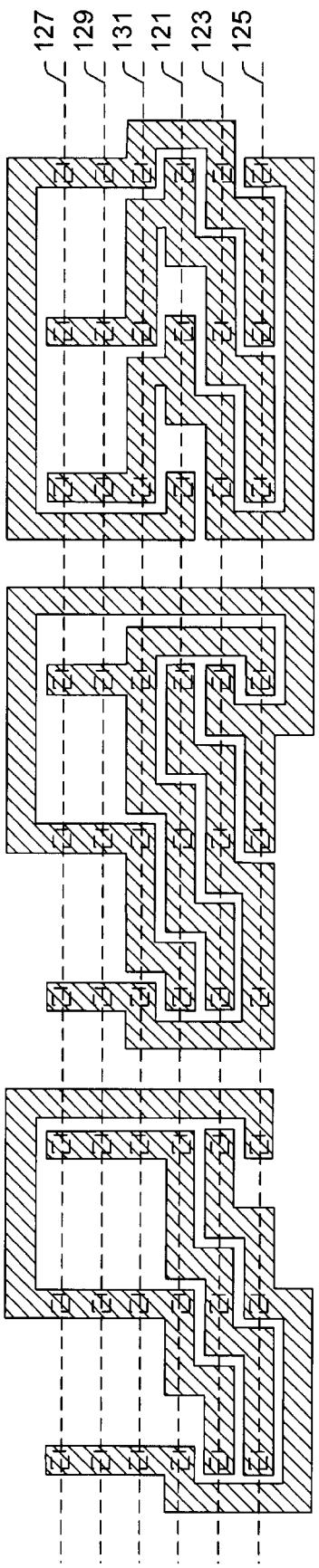

Portion of old mask layer (device code F5)

Portion of new mask layer (device code AC)

MASK-PROGRAMMABLE ROM CELL

BACKGROUND OF THE INVENTION

1. Field of the Invention

This invention relates to integrated circuit fabrication, and more particularly to methods, structures and masks associated with programming an identification code into an integrated circuit.

2. Description of the Related Art

The following descriptions and examples are not admitted to be prior art by virtue of their inclusion within this section.

Integrated circuit manufacturers often find it useful to include an identification code, or "device ID," within a manufactured integrated circuit. The code is generally contained within a set of memory cells, such as a register, which is externally readable, often during test of the integrated circuit (IC). The circuit identification code may provide information on, for example, the manufacturer, the particular circuit design, and/or the process used to fabricate the circuit. Identifying an integrated circuit using a device ID may allow close synchronization of the integrated circuit device design with back-end processing steps. Such back-end processing steps may include, for example, testing individual devices or attachment of individual devices to printed circuit boards. Identification codes may be particularly useful for manufacturers producing many diverse ICs, such as manufacturers of custom-designed application-specific integrated circuits (ASICs). Identification may also provide an opportunity for the end users of a product to resolve certain inventory problems in an unambiguous way.

In some cases, an identification code is externally programmed into a programmable, read-only register dedicated for that purpose. It is generally desired that the register be read-only in order to minimize the possibility that its contents will be altered during subsequent processing. The programming may take place during, for example, an initial wafer sort test. Although such external programming may allow additional information to be represented by an identification code, such as die-specific test performance information, there are disadvantages to this approach. In particular, external programming may be error-prone in that the possibility exists for the wrong code to be inadvertently programmed into a particular circuit's identification register, which then renders that particular device useless to the extent that the device must be properly identified using the code. Also, non-volatile registers require the availability of special processing steps, which in themselves represent an added cost element.

An alternative approach is to design the metallization of the integrated circuit to directly wire the memory cells to on-chip programming voltages. The programming voltages are typically power supply voltages for the chip, so that the identification code is programmed into the identification register upon any power-up of the device (during testing, for example). Such internal programming of the circuit identification code may involve multiple mask levels of the integrated circuit, which are discussed briefly below.

Integrated circuit fabrication typically requires the use of multiple photolithography masks. Each mask is used to transfer a pattern to an upper layer of the semiconductor topography from which the circuit is formed, where the semiconductor topography includes a semiconductor wafer and the various layers and structures formed upon and within the wafer during the IC fabrication process. Multiple photolithographic masking steps are performed at various stages of the process, with patterning of one layer often followed by formation of and patterning of an additional layer. Generally, photolithography begins with formation of a layer of a photosensitive material called photoresist over the semiconductor topography. The photoresist is exposed to radiation through an appropriately patterned mask, so that properties of the photoresist are altered by the radiation in a pattern corresponding to the mask pattern. Depending on the particular type of the photoresist, either exposed or unexposed portions of the photoresist are then preferentially removed. The resulting photoresist pattern may be transferred to the underlying semiconductor topography, by processes such as etching or implantation of dopant impurities, as appropriate for the particular layer of the IC being formed.

During the product life cycle of an IC, various revisions may be made to its design and/or fabrication process. In fact, such revisions are often made during initial testing of a circuit design before the first devices are sold. Such revisions often involve changes to the mask used for patterning of a particular layer within the circuit. It is desirable in such cases to change the circuit identification code of a circuit undergoing a revision. Different codes can be used to distinguish one revision of the device from another, for example, or to later identify a particular mask or sequence of masks used to form a device.

In the case described above of a circuit identification register having its memory cells internally wired to programming voltages, however, changing the circuit identification code may require modification of multiple masks used to fabricate the integrated circuit. This can result in excessive time and expense, particularly in a case for which the revision of the circuit design requires changing of only one or two masks. It would therefore be desirable to develop a method of altering the circuit identification code of an IC when a mask pattern change is implemented. The code alteration should require changes to a minimal number of masks, and should not require excessive area on the circuit to implement.

SUMMARY OF THE INVENTION

The problems outlined above may be in large part addressed by a structure described herein for programming a memory cell on an integrated circuit. The structure provides access at multiple mask levels of the integrated circuit to each of the programming voltages which may be used to program the memory cell. In a preferred embodiment, there are two programming voltages used: the upper polarity of the circuit's power supply (typically called "$V_{DD}$" or "$V_{CC}$"), and the lower polarity of the power supply (typically called "$V_{SS}$," and usually at ground potential). Application of $V_{DD}$ to the input of the memory cell would typically program a logical "1" into the cell, while application of $V_{SS}$ would program a "0." In such an embodiment, both $V_{DD}$ and $V_{SS}$ are available at multiple mask levels, so that modification of a single mask can be used to change the value programmed into the memory cell. Preferably, all of the programming voltages are accessible at each mask level within the circuit involving either patterning of a conductor or formation of contacts or vias between conductor layers.

In an embodiment, the structure includes a conductive signal path extending through multiple horizontally conductive layers of the integrated circuit from a programming voltage pad (or node) to an input of the memory cell. The multiple horizontally conductive layers may be stacked above one another, such that the conductive signal path is in a generally vertical direction. A "horizontally conductive layer" as used herein is a layer having conductive structures arranged in a primarily horizontal direction (parallel to a polished surface of the semiconductor substrate on which the circuit is formed). A horizontally conductive layer may therefore be an interconnect layer, including patterned conductive interconnect lines. Such interconnect lines may be formed from metal, or other conductive materials such as polysilicon, which might be used in a local interconnect level. Patterned doped regions within the semiconductor substrate could also form a horizontally conductive layer. The horizontally conductive layers typically have via or contact layers interposed between them, where the via/contact layer is a dielectric layer having conductive vias or contacts formed therethrough. "Via" is typically used to describe vertical connections between metal lines, while "contact" may be used to describe a vertical connection made to a semiconductor regions.

The above-described conductive signal path includes portions selected from multiple alternate path portions formed within the multiple horizontally conductive layers through which the signal path extends. In a preferred embodiment, the multiple alternate path portions are formed within each of the horizontally conductive layers. Each alternate path portion within a layer may correspond to one of the programming voltages available for programming the memory cell. In an embodiment for which the available programming voltages are $V_{DD}$ and $V_{SS}$, for example, two corresponding alternate path portions may be available within a horizontally conductive layer. Each alternate path portion may further be connected to a pad or node for a respective programming voltage. Selection of the alternate path portions included within the conductive signal path may be done through the positions of conductive vias or contacts formed within via or contact layers interposed between the horizontally conductive layers. For example, one set of via positions may result in connection of $V_{DD}$ to the memory cell input, while a different set of via positions may cause $V_{SS}$ to be connected.

Selection of the alternate path portions included in a signal path such as that described above may be done as part of making the masks used in fabrication of the integrated circuit. The masks used to fabricate the integrate circuit may also include patterns to form portions of the above-described programming structure. A programming structure portion may be adapted to pass multiple programming voltages from one layer of the integrated circuit to an adjacent layer, where the programming voltages are adapted to program a memory cell on the integrated circuit.

An embodiment of a method for making a mask includes selecting one of multiple configurations of the programming structure portion to be formed using the mask. If the mask is for patterning of a horizontally conductive layer, the programming structure portion may include an alternate path portion for each of the multiple programming voltages, and the configurations to be selected from may include alternative arrangements (layouts) of these alternate path portions. One of the layouts to be selected from may be arranged such that the relative lateral positions of the programming voltages carried by contacts to the alternate path portions from below are unchanged with respect to relative lateral positions of the programming voltages carried by contacts to the alternate path portions from above. As an example, a configuration of two path portions may be selected such that if $V_{DD}$ and $V_{SS}$ are passed down to the path portions from above with $V_{DD}$ on the left and $V_{SS}$ on the right, $V_{DD}$ and $V_{SS}$ are also passed down from the path portions to the next underlying layer with $V_{DD}$ on the left and $V_{SS}$ on the right. The layouts to be selected from in making a mask may also include layouts arranged such that the relative lateral positions of the programming voltages carried by contacts to the alternate path portions from below are altered with respect to relative lateral positions of the programming voltages carried by contacts to the alternate path portions from above. To illustrate using the above example, a configuration could instead be selected such that $V_{DD}$ and $V_{SS}$ are passed down to the path portions from above with $V_{DD}$ on the left and $V_{SS}$ on the right, but the voltages are passed down from the path portions to the next underlying layer with $V_{DD}$ on the right and $V_{SS}$ on the left. In a method for making a mask to pattern a via or contact layer, the programming structure portion may include multiple conductive vias or contacts, and the configurations to be selected from in making the mask may include different positions of the vias.

A computer-usable carrier medium may include digital representations of the alternative configurations for a programming structure portion from which a programming structure pattern may be selected. The carrier medium may be a storage medium, such as a semiconductor memory or a magnetic or optical disk. The carrier medium could also include a transmission medium, such as a wire, cable, or wireless link, or a signal traveling along such a wire, cable or link. The digital representations may take the form of, for example, program instructions executable to generate the alternative patterns, or data points representing the patterns. The alternative patterns may include alternative arrangements of a set of multiple conductive path portions, where each conductive path portion is adapted to pass a respective programming voltage. The alternative configurations may also include alternative positions of a set of contact or via openings.

Use of a programming structure as may be defined by the above-described masks may allow masks used in fabrication of an integrated circuit to be identified after the circuit is made. A method for identifying a mask used in the manufacture of an integrated circuit may include reading a circuit identification code stored in a circuit identification register on the integrated circuit, and comparing a read value of one or more bits within the code to a design value of the bit(s). The design value is the value expected based on the configuration of a programming structure formed using the mask (typically along with other masks). In an embodiment, the method includes comparing a read circuit identification code from one revision of the integrated circuit to that from another revision, and comparing a difference between the codes to an expected alteration of the code based on the change in the programming structure caused by any mask changes associated with the revision.

The memory cell programmed by the above-described programming structure may be within a circuit identification register on the integrated circuit, and may be adapted to store a bit of a circuit identification code stored within the register. In addition to programming of a circuit identification code into a set of memory locations, the programming structure may be used to program memory locations for other purposes. The structure, methods, and carrier medium described herein are believed to be useful for any application for which the ability is desired to use a number of masks as low as one to change the value stored in a memory cell on an integrated circuit.

BRIEF DESCRIPTION OF THE DRAWINGS

Other objects and advantages of the invention will become apparent upon reading the following detailed description and upon reference to the accompanying drawings in which:

FIG. 3a is a top view of an exemplary arrangement of alternative paths which may be formed within a horizontally conductive layer of the integrated circuit to implement a programming structure;

FIG. 3b is a top view of an arrangement of paths which may be used as an alternative to the arrangement of FIG. 3a;

FIG. 4a is a top view of the path arrangement of FIG. 3a illustrating an alternative position for vias or contacts to an underlying layer;

FIG. 4b is a top view of the path arrangement of FIG. 3b illustrating an alternative position for vias or contacts to an underlying layer;

FIG. 5a is a top view illustrating formation of paths having the arrangement of FIG. 4b formed on a layer overlying that of paths having the arrangement of FIG. 4a;

FIG. 8b is a top view of an arrangement of paths which may be used as an alternative to the arrangement of FIG. 7a;

FIG. 9b is a top view of an embodiment of an arrangement of paths which may be used as an alternative to the arrangement of FIG. 8a;

FIG. 10a is a top view of an exemplary arrangement of alternative paths which may be formed to implement a programming structure in which three programming voltages are used;

FIG. 10b is a top view of a path arrangement which may be used as an alternative to the arrangement of FIG. 10a;

FIG. 10c is a top view of an additional path arrangement which may be used as an alternative to the arrangements of FIGS. 10a and 10b;

Figure 1:
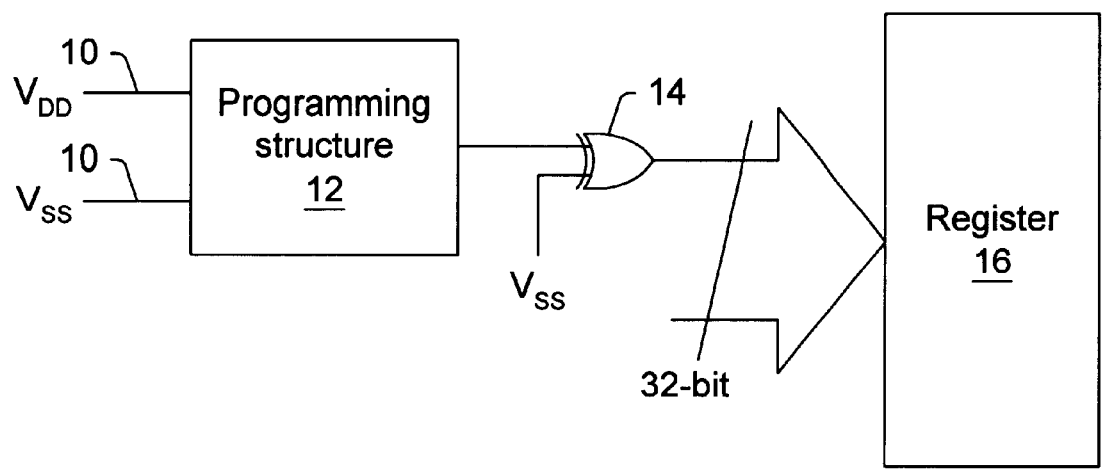
FIG. 1 illustrates an embodiment of an identification register and associated programming structure for one of its component bits which may be formed on an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

An embodiment of an identification register and associated bit-programming circuitry which may be formed on an integrated circuit is shown in FIG. 1. Programming voltages 10, in this case $V_{DD}$ and $V_{SS}$, are inputs to programming structure 12, which selects one of the programming voltages and sends it to exclusive-or gate 14. In other embodiments, different programming voltages and/or a greater variety of programming voltages could be used (in the case of multi-valued logic, for example). Exclusive-or gate 14 buffers the programming signal, sending the same logical value forward to register 16. The exclusive-or gate may therefore be omitted in some embodiments. In the embodiment of FIG. 1, gate 14 programs one of 32 bits into register 16, and there are corresponding gates for the other 31 bits. The number of bits in the circuit ID may be any convenient value. Circuits fabricated using a large number of masks may have more bits in an ID, for example, than those made using fewer masks. The circuit ID may also include other information in addition to that related to the masks used in the process, and may therefore contain bits associated with such other information.

Programming structure 12 as used herein includes the physical and electrical structure used to select which of the available programming voltages is used to program each bit of the circuit ID (or any other information which might be programmed into memory cells using the structure). As used herein, program structure 12 includes such structure for all of the bits, though the structure and methods could also be described in terms of a separate programming structure for each bit. In a case such as FIG. 1 for which two programming voltages are used, programming structure 12 may also be referred to as a "parity matrix" in that it selects between two input signals, and at each level it performs one of a possible two transformations (either passing them through unchanged or else interchanging them) which are the allowed parity transformations in the mathematical sense. Use of a register such as register 16 to store the programmed bits may particularly be advantageous when the stored value is to be read using a testing interface such as the Joint Test Action Group ("JTAG") standard. The register may not be necessary in every embodiment, however. The memory cell programmed using programming structure 12 may therefore be either within a register such as register 16 or be some other type of memory cell. The memory cell is preferably a read-only cell, so that the stored information cannot be overwritten.

Figure 2:
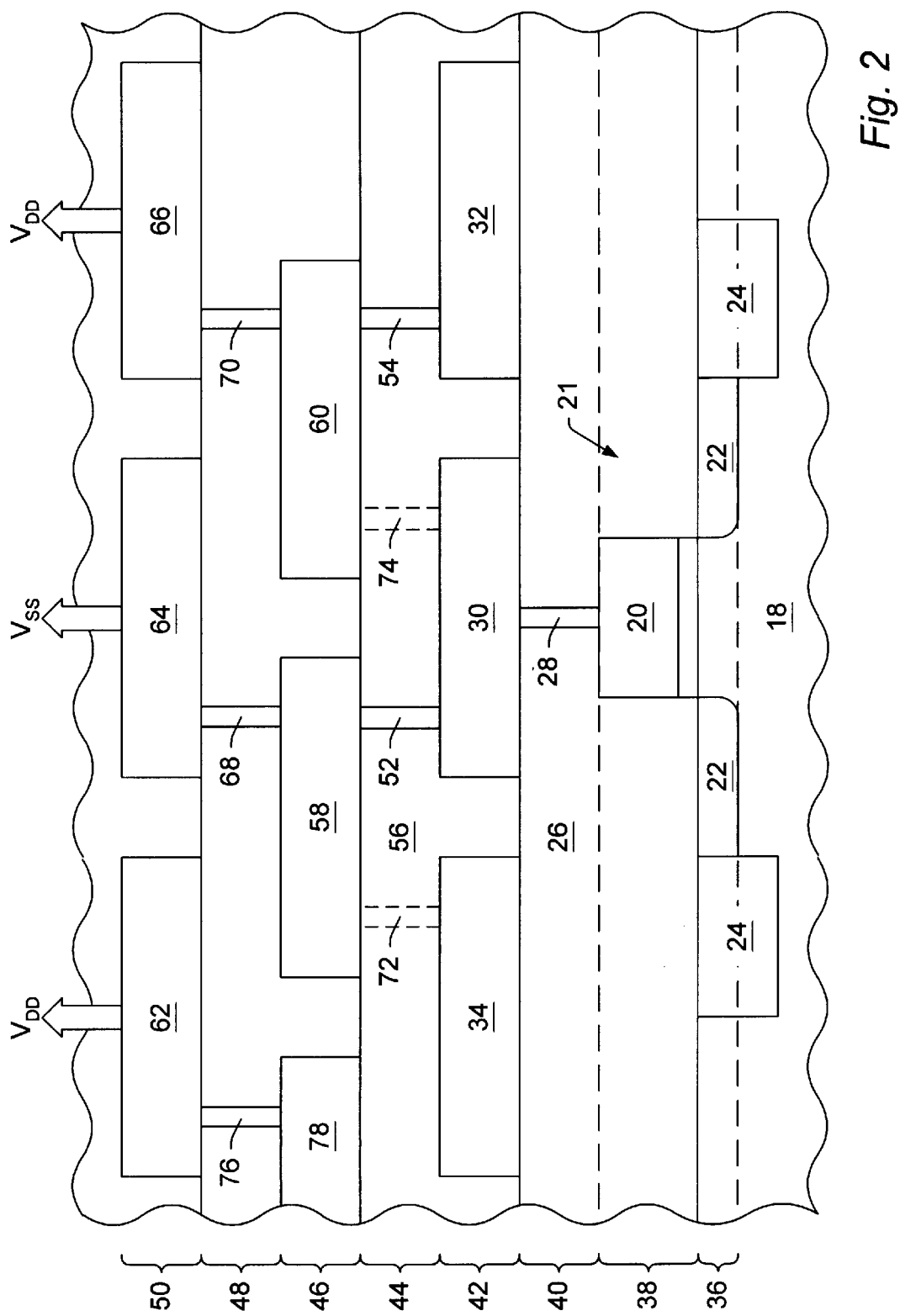
FIG. 2 is a partial cross-sectional view of an embodiment of a programming structure for programming a memory cell.

The cross-sectional view of FIG. 2 provides a simplified illustration of the programming structure concept described herein. A transistor 21 including gate conductor 20 and source/drain regions 22 is formed in and on semiconductor substrate 18. In the embodiment of FIG. 2, the transistor is a metal-oxide-semiconductor (MOS) transistor, but other types of transistors such as bipolar transistors might be used in other embodiments. Semiconductor substrate 18 is preferably a silicon wafer, but other semiconductor or even non-conductive (such as silicon-on-insulator) materials could also be used. The substrate is doped either n-type (for producing a p-channel transistor) or p-type (for an n-channel transistor). More specifically, substrate 18 may be an epitaxial silicon layer grown on a monocrystalline silicon substrate, or an n-type or p-type well region formed in a monocrystalline silicon substrate. In some embodiments, substrate 18 could be a semiconductor layer formed over a separate semiconducting or non-semiconducting substrate. Gate conductor 20 is preferably formed from polysilicon, but could be made from other conductors such as metals or silicides, or from combinations of conductors. Source/drain regions 22 formed within substrate 18 are doped to have opposite conductivity type than the surrounding portions of substrate 18. In the embodiment of FIG. 2, dielectric isolation regions 24 isolate the transistor electrically from adjacent transistors or other circuit elements. Substrate 18 typically includes many other transistors not shown, laterally spaced across the substrate. Some of the transistors, such as that shown in FIG. 2, may be associated with storing of an identification code for an integrated circuit built on substrate 18. Others of the transistors are part of the "production" circuitry of the device, or the circuitry directly used to perform the functions that the integrated circuit provides.

Dielectric 26 is formed over substrate 18 and gate conductor 20, and a contact 28 extends through the dielectric to connect gate conductor 20 to overlying conductor 30. Other conductors 32 and 34 are also formed in the layer above dielectric 28, with additional dielectrics, vias, and conductor layers formed above. The programming structure of FIG. 2 may be viewed as being formed within multiple stacked layers, as delineated by the brackets at the left of the figure. Layers 36, 38, 42, 46, and 50 are horizontally conductive layers, while layers 40, 44 and 48 are contact or via layers used to make vertical connections between horizontally conductive layers. Layer 36 may include conductive structures formed by patterned doping of substrate 18, such as the doping used to form source/drain regions 22. Layer 38 may include conductive structures formed by patterning of polysilicon (or other conductive material(s) used to form gate 20). The other horizontally conductive structures shown in FIG. 2 include conductive structures formed by patterning of the conductive materials used to form interconnects in the integrated circuit. Such materials may include metals such as tungsten, titanium, aluminum and copper, or combinations of such metals. Similar materials may be used to form contact 28 and vias such as vias 52 and 54. The dielectrics included in the structure of FIG. 2 may be any of various dielectrics suitable for integrated circuit fabrication, including silicon oxides, nitrides and/or oxynitrides as well as dielectrics having high dielectric constant (may be particularly suitable for transistor gate dielectrics) or low dielectric constant (may be particularly suitable for interlevel dielectrics such as dielectric 56) compared to that of silicon dioxide.

Conductors 30, 32, 34, 58, 60, 62, 64, and 66 of FIG. 2 represent conductive path portions which may be included within a signal path connecting a programming voltage of the circuit to the input of a memory cell. Gate 20 of transistor 21 may serve as the input of a memory cell. Transistor 21 may be part of a memory cell within a register such as register 16 of FIG. 1, or part of a gate leading to a memory cell, such as exclusive-or gate 14 of FIG. 1. Gate 20 could also form the input of a memory cell not within a register. In the embodiment of FIG. 2, the two programming voltages are $V_{DD}$ and $V_{SS}$. Conductors 62 and 66 are connected to a pad or node carrying $V_{DD}$, and conductor 64 is connected to a pad or node carrying $V_{SS}$. In an embodiment for which layer 50 is the uppermost layer in the programming structure, the connections to $V_{DD}$ and $V_{SS}$ are formed within layer 50. In other embodiments, the connections to $V_{DD}$ and $V_{SS}$ may be made through additional overlying layers not shown. Conductors 62 and 66 may be part of the same conductive path, connected together outside the plane of the cross-section of FIG. 2. At least two separate path portions exist in each of layers 50, 46 and 42, however, one for connection to $V_{DD}$ and one for connection to $V_{SS}$. In this way, both voltages are available at each of these levels, so that the voltage connected to transistor gate 20 can be changed by reconfiguring a mask used to form any one of the levels.

In the embodiment of FIG. 2, the signal path between a programming voltage and transistor 21 connects $V_{SS}$ to gate 20. The signal path includes path portions 64, 58 and 30, vias 68 and 52, and contact 28. Another signal path within the structure includes path portions 66, 60 and 32, and vias 54 and 70. This path connects to $V_{DD}$, but does not connect to the input of the memory cell. The availability of at least two alternate paths on layers 42, 46 and 50 allows the voltage connected to gate 20 to be changed by altering a mask for one of the levels within the programming structure. This is illustrated by alternate via locations 72 and 74 within via layer 44, denoted by dashed lines. If the mask used to form layer 44 is altered to pattern vias 72 and 74 instead of 52 and 54, gate 20 will be connected to $V_{DD}$ instead of $V_{SS}$. In this way, the voltage programmed into a memory location can be altered by changing a single mask. The via positions patterned by the mask for layer 48 could similarly be altered to change the bit being programmed into the memory cell. For example, vias 76, 68 and 70 could be replaced with a pair of vias connecting path portion 62 to portion 58 and path portion 64 to portion 60. The programmed bit may also be changed by altering a mask used to form one of the horizontally conductive layers. This may be understood by considering layer 46 of FIG. 2. Conductors 78, 58, and 60 could be replaced with, for example, one conductor extending between via 76 of overlying layer 48 and via 52 of underlying layer 44, and another conductor extending between overlying via 68 and underlying via 54. In this way, $V_{DD}$ could be connected to gate 20 instead of $V_{SS}$. The programming structure shown in FIG. 2 extends between layer 50 and layer 40 to connect a programming voltage to gate 20. In other embodiments, however, the programming structure could extend further downward, to include alternate path portions formed in layer 38 and/or 36. In such an embodiment, a connection would be formed from the lowermost layer of the programming structure back up to the input of the memory cell.

The programming structure shown in FIG. 2 illustrates some of the programming structure concepts described herein, such as the use of multiple alternate path portions on multiple levels of a programming structure to allow alteration of the value programmed into a memory cell by altering as few as one mask. In order to illustrate these concepts using the cross-sectional view of FIG. 2, however, conductor and via arrangements are shown in FIG. 2 which may not be the most advantageous in terms of, for example, reducing the number of different mask options needed. Top views of exemplary conductor and via arrangements which may be used to implement a programming structure such as that of FIG. 2 are shown in FIGS. 3–10.

Top views of two alternative path arrangements which may be used in forming a programming structure for selecting between two programming voltages are shown in FIGS. 3a and 3b. The patterns of FIG. 3 may be formed within a horizontally conductive layer of an integrated circuit, or upon a photomask used to pattern such a conductive layer. Depending on the type of photoresist used, the mask used to produce the patterns shown may actually contain the negative image of that being produced in the conductive layer. Although the patterns of FIG. 3 and other figures herein are hereinafter generally referred to as "conductive paths" or "path arrangements", it is to be understood that they could also be mask features. Conductive path 80 of path arrangement 81 in FIG. 3a includes a contact/via region 82 at which a contact or via makes connection to the path from above, and a contact/via region 84 at which a contact or via makes connection from the layer below. Similarly, alternate path 86 includes contact/via region 88 underlying connection to the layer above and contact/via region 90 overlying connection to the layer below. The vertical (on the page) alignment of the contact/via positions allows the path arrangement of FIG. 3a to be described in terms of the relative lateral positions of the signals carried by the alternate paths. Assuming, for example, that $V_{DD}$ is carried to path 80 by a via overlying region 82, and $V_{SS}$ is carried to path 86 by a via overlying region 88, then $V_{DD}$ is to the left of $V_{SS}$ in the contact/via layer overlying the arrangement of FIG. 3a. In the contact/via layer underlying the path arrangement, however, $V_{DD}$ is to the right of $V_{SS}$. In other words, the lateral positions of the voltages are switched within the layer containing this arrangement.

In the alternative path arrangement 93 of FIG. 3b, the via positions are the same as for arrangement 81 of FIG. 3a, but the conductor paths are different. The arrangement of FIG. 3b does not switch the lateral positions of the programming voltages between the vias from above and the vias from below. For example, if $V_{DD}$ is connected to path 92 from above at contact/via region 96, on the left side of the arrangement, $V_{DD}$ is passed to the layer below at contact/via region 100, still on the left side of the arrangement. The lateral positions of the programming voltages are therefore left unchanged by the path arrangement and via positions of FIG. 3b. The arrangements of FIG. 3a and FIG. 3b can therefore be selected from by a mask designer when establishing the value to be programmed into a particular memory cell. Consider, for example, a mask containing arrangement 81 as part of a programming structure for a memory cell. Depending upon the path arrangements and via positions used in layers above and below the layer patterned by this mask, a particular one of the two available programming voltages would be connected to the input of the memory cell. If a change were subsequently needed in the mask, and the memory cell programmed using arrangement 81 stored a bit of an identification code for the integrated circuit, it might be desirable to alter the bit of the code in order to reflect the mask revision in the code. Such an alteration of the code bit could be accomplished by substituting arrangement 93 of FIG. 3b for the previously-used arrangement 81 in the programming structure of the bit in question. The identification code of the circuit fabricated using the revised mask would then include the altered bit.

The alternative arrangements of FIGS. 3a and 3b allow the programming of a memory cell to be altered by changing the mask used to form a horizontally conductive layer. For a given set of via positions, the choice of arrangement determines whether the relative positions of the programming voltages are changed within the layer or not. Because the ultimate connection to the memory cell input includes a via or contact at a specific location, control of the lateral position of the programming voltage can be used to determine which voltage is used to program the cell.

Another way of altering the bit programmed by a programming structure using the arrangements of FIG. 3 is illustrated by comparison of FIG. 3 to FIG. 4. FIGS. 4a and 4b show the arrangements of FIGS. 3a and 3b, respectively, but with the vertical position of the vias connecting to the underlying layer shifted upward with respect to the position of FIG. 3. This shift of via position changes the behavior of each arrangement with respect to the relative positions of the programming voltages. It can be seen that arrangement 81, when used with the via positions of FIG. 4a, does not alter the relative positions of the programming voltages carried by the vias contacting from above with respect to the positions of the voltages carried by the vias contacting from below. On the other hand, arrangement 93, when used with the via positions of FIG. 4b, does alter the relative positions of the programming voltages carried by the vias connecting from below, as compared to those of the voltages carried by the vias connecting from above. It is noted that the path arrangements within the horizontally conductive layer are the same for FIGS. 3a and 4a, only the positions of the vias arranged below the conductive paths are different.

Comparison of FIG. 4a to FIG. 3a and of FIG. 4b to FIG. 3b shows that for a given path arrangement of those in FIGS. 3 and 4, shifting of the downward-connecting via positions can be used to alter the relative lateral positions of the programming voltages. Via positions corresponding either to FIG. 3 or to FIG. 4 can therefore can be chosen by a designer of the contact/via mask underlying a path arrangement, in order to select the bit programmed into a memory cell. The portion of such a contact/via mask corresponding to the views of FIGS. 3 and 4 would need only to contain a pattern of the two vias connecting from below, in either the position shown in FIG. 3 or the higher position of FIG. 4. The concept of altering the programming voltage through via position selection is also illustrated by the via options discussed above within layer 44 of the structure of FIG. 2. However, the programming structure of FIG. 2 doesn't utilize well-defined lateral positions for the programming voltages in the manner of the path arrangements of FIGS. 3 and 4. As discussed further below in the description of FIG. 6, alternate via positions are also available for upward-connecting vias such as vias 82 and 88 of FIGS. 3a and 4a.

Figure 5A:
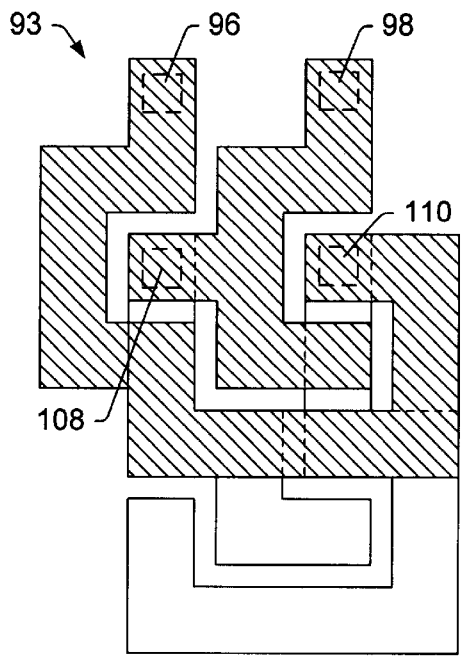

The path arrangements of FIGS. 3 and 4 can be "stacked" within an integrated circuit to form a programming structure allowing alteration of the programmed value on each of multiple levels. Simple examples of such stacking are shown in the top views of FIGS. 5a and 5b. In FIG. 5a, path arrangement 93 is formed in a horizontally conductive layer overlying that of path arrangement 81, and the arrangements are vertically connected using the via positions of FIGS. 4a and 4b within a contact/via layer interposed between the two path arrangements. Contact/via regions 108 and 110 overlie vias or contacts connecting arrangement 93 to contact/via regions 82 and 88, respectively, in underlying arrangement 81. Stacking of the two path arrangements using the via positions of FIG. 3b gives the structure shown in FIG. 5b. Shifting of the positions (by comparison to FIG. 5a) at which the vias connect to arrangement 93 necessarily shifts the positions at which the same intervening vias connect to underlying arrangement 81.

Figure 5B:
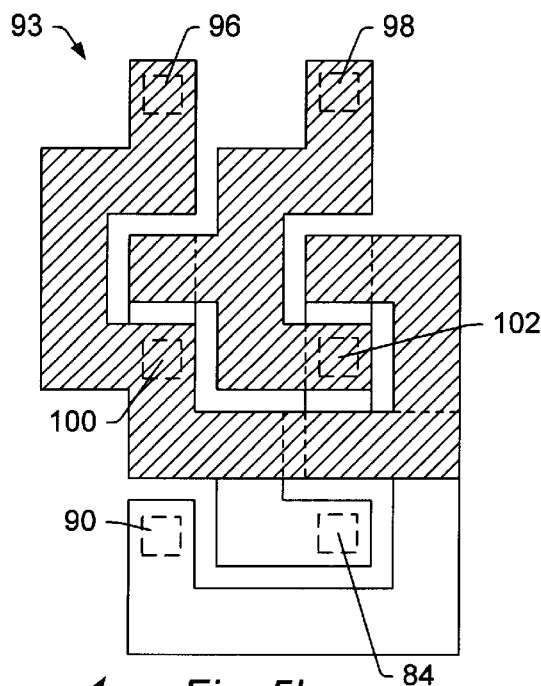
FIG. 5b is a top view of the two level path arrangement of FIG. 5a, but with an alternative via location between the levels.
Figure 6A:
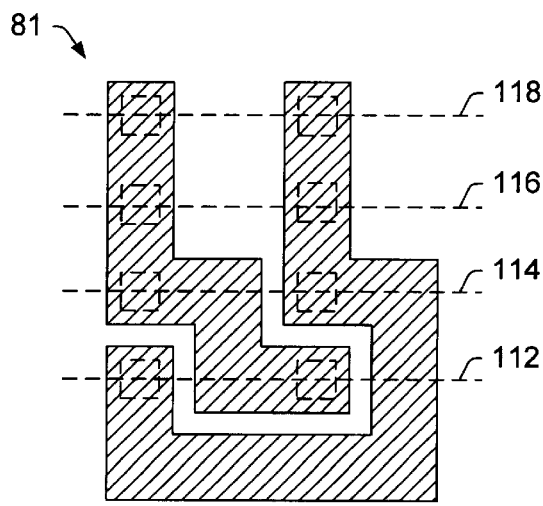
FIG. 6a is a top view of the path arrangement of FIG. 3a showing optional via locations.
Figure 6B:
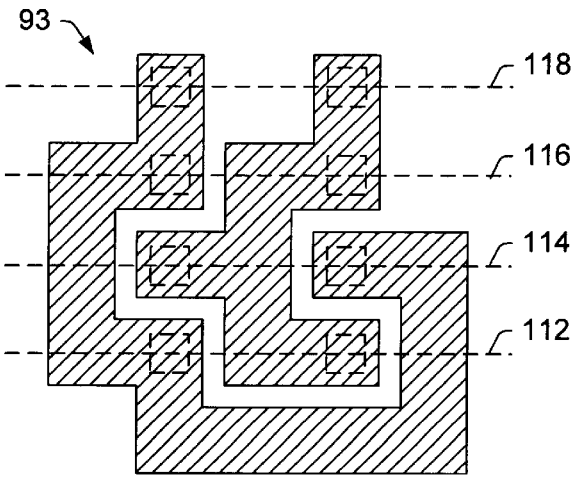
FIG. 6b is a top view of the path arrangement of FIG. 3b showing optional via locations.

The stacking arrangements of FIGS. 5a and 5b are only two of multiple possible configurations using these path arrangements. Path arrangement 81 could be stacked over path arrangement 93, or either one of arrangements 81 and 93 could be used in two adjacent horizontally conductive layers. For each of these stacking possibilities, two positions of the set of interconnecting vias are possible. For the case of a programming structure using two programming voltages, the two path arrangements available for each horizontally conductive layer, and two via positions available for each contact/via layer provide a complete set of the structures needed to allow selection at each layer of the relative lateral positions of the programming voltages, and thereby selection of the program voltage forwarded to memory cell. The via position choices for arrangements 81 and 93 are illustrated in FIGS. 6a and 6b, respectively. Positions 112 and 114 are the possible positions for vias connecting to the path arrangement from below, while positions 116 and 118 are options for vias connecting to the arrangement from above.

It can be seen that switching between via positions 112 and 114 causes a change in the relative positions of the programming voltages, while switching between positions 116 and 118 does not cause such a change. The assignment used herein of positions 112 and 114 to vias from below and 118 and 116 to vias from above is arbitrary and could be reversed. For the arrangement set of FIGS. 3–6 to allow a change in the programmed voltage by changing the via positions within one via layer, however, it is necessary that when stacking the path arrangements, positions 112 and 114 in one arrangement are aligned with 116 and 118 in the vertically adjacent arrangement. Otherwise, changing of the via positions may not alter the programming of the corresponding memory cell. This alignment of the lower (in the orientation of FIG. 6) via positions of one path arrangement with the upper positions of the next causes an offset in the footprints of the stacked structures, as can be seen in the examples of FIG. 5. This lateral "creeping" of the stack can be mitigated by rotating the path arrangements by 180° with respect to one another, so that via positions 112 and 114 of one arrangement are aligned with positions 118 and 116, respectively, of the next.

Figures 7A, 7B, 7C, 7D:
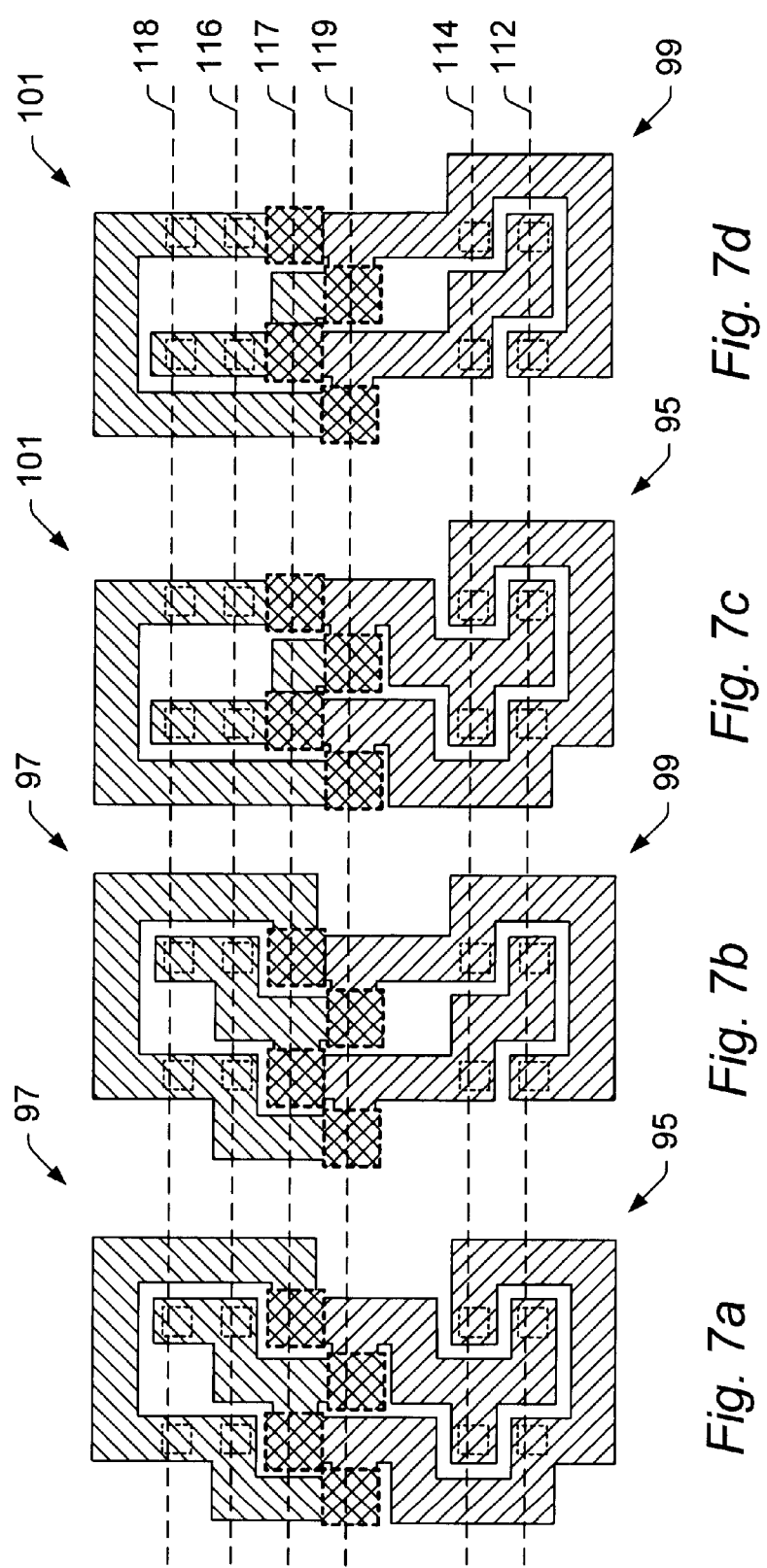
FIG. 7a is a top view showing alternative path arrangements on two levels, where the upper level material is used to mask formation of the lower level conductive paths.
FIG. 7b is a top view of a two-level structure similar to that of FIG. 7a, but with an alternative path arrangement on the lower level.
FIG. 7c is a top view of a two-level structure similar to that of FIG. 7a, but with an alternative path arrangement on the upper level.
FIG. 7d is a top view of a two-level structure similar to that of FIG. 7c, but with an alternative path arrangement on the lower level.

It is noted that the stacking illustrated by FIG. 5 may need to be modified in the case of a horizontally conductive layer formed by doping of a semiconductor substrate. Since such doped layers are often formed using self-aligned processes in which a patterned polysilicon layer masks an ion implantation such as a source/drain implant, the polysilicon layer portion directly above a path arrangement formed within a doped layer would generally be used in masking the dopant introduction. Any connection of the path arrangement within the doped layer to a polysilicon structure (such as another path arrangement or a transistor gate) would have to involve a layout which avoided having polysilicon above the diffusion layer, except where a vertical connection option was intended. Also, nowhere could the polysilicon layer be allowed to interfere with the connective topology of the diffusion layer by overlaying it in such a way as to sever any potential electrical connection in the diffusion layer. Therefore the connection schemes shown in FIG. 5a are not suitable in such a layer. A variant which is believed to be suitable in this circumstance is shown in FIG. 7, where the new routing is accomplished through the expedient of routing one of the polysilicon traces around the outside of the standard footprint for the polysilicon layer, and making some traces in the diffusion layer of double width (i.e., adding a lateral extension to each of the diffusion layer traces). For example, path arrangement 95 is formed within a diffusion layer in the embodiment of FIG. 7a. Arrangement 95 is similar in shape to arrangement 93 of FIGS. 3–6, except for the addition of a lateral extension near the top of each of the conductors. These extensions may be used to form a pair of buried contacts at contact position 119, where the buried contacts connect the paths in arrangement 95 to path arrangement 97 formed in an overlying polysilicon layer. Alternatively, the path arrangements could be connected using a pair of buried contacts at contact position 117 rather than at position 119. It can be seen that use of the contacts at position 119 will cause the relative lateral positions of voltages passed through path arrangement 97 to be unchanged, while use of contacts at position 117 will cause the relative lateral positions of voltages passed from the Metal-1 layer above arrangement 97 to be switched upon connection to the diffusion layer. In some technologies it is possible if desired to connect the diffusion layer to the polysilicon layer through other vertical connection methods such as simple contacts or so-called 'local interconnect' straps, and the method outlined here in no way requires a buried contact layer in order to avoid the problem of some particular layer masking one or more layers below it.

FIG. 7b shows an alternative configuration in which path arrangement 97 is formed within a polysilicon layer overlying a diffusion layer in which alternative path arrangement 99 is formed. Arrangement 99 is similar to arrangement 81 of FIGS. 3–6 except for the addition of lateral extensions to each path allowing buried contact formation at contact position 119. The configurations of FIGS. 7c and 7d are similar to those of 7a and 7b, respectively, except that alternative path arrangement 101 is formed within the polysilicon layer. Contact/via positions 118 and 116 may be chosen between in connecting to a layer above the polysilicon layer, as described above in the discussion of FIG. 6. Path arrangements 93 and 81 of FIG. 6, rather than the arrangements of FIG. 7, could then be used in the overlying layers. Contact/via positions 112 and 114 may be chosen between in connecting to a layer below the diffusion layer, as discussed further above in the description of FIG. 6. There is typically no horizontally conductive layer formed below the diffusion layer, so that such contacts would not be needed. The configurations as shown in FIG. 7 could also be used at higher points in the integrated circuit in some embodiments, however, in any situation for which a lateral displacement between the path arrangements in adjacent layers is desired. The buried contacts shown at contact positions 117 and 119 in the embodiment of FIG. 7 are slightly larger than the contacts or vias shown at positions 112, 114, 116, and 118. This is normal for buried contacts in self-aligned MOS etch processes, but the relative sizes of the contacts could be different in other embodiments.

Figure 8A:
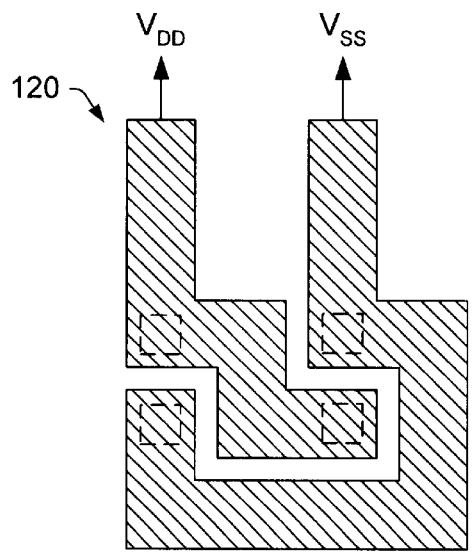
FIG. 8a is a top view of an embodiment of a path arrangement for use in the uppermost layer of a programming structure.
Figure 8B:
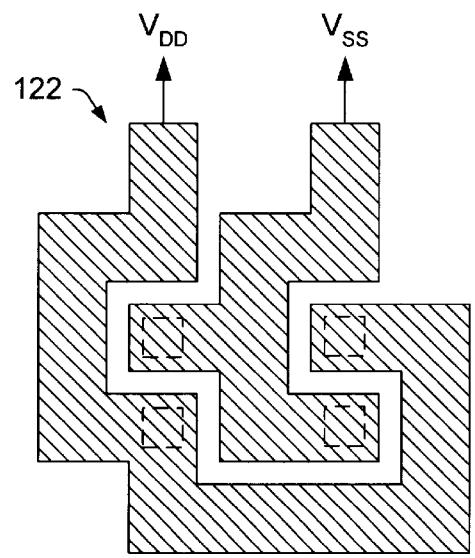
Figure 9A:
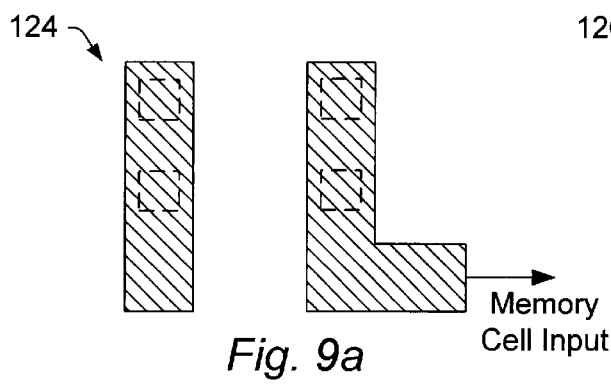
FIG. 9a is a top view of an embodiment of a path arrangement for use in the lowermost layer of a programming structure.
Figure 9B:
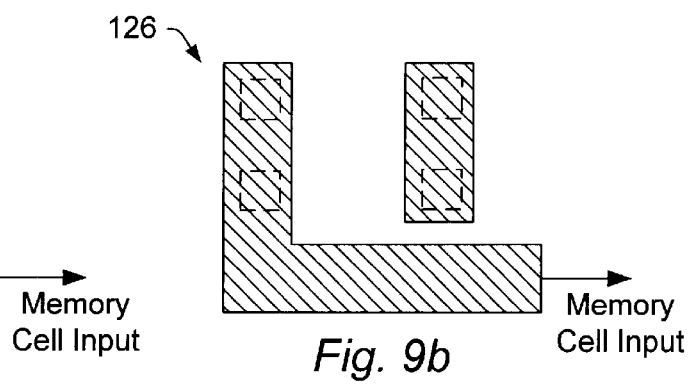

Path arrangements adapted for use on the uppermost layer of a programming structure are shown in FIG. 8. Path arrangements 120 and 122 are similar to arrangements 81 and 93, respectively. Instead of via connections up to another layer, however, the structures of FIG. 8 have connections to the appropriate programming voltages. The connection to each voltage is preferably by extension of the conductor within the same layer, to a contact pad or node carrying the appropriate voltage during circuit operation. The two path arrangement options may be selected between in order to select the programming voltage used, in a manner similar to that described above for the structures of FIGS. 3–6. Path arrangements adapted for use on the lowermost layer of the programming structure are shown in FIG. 9. The arrangements of FIG. 9 do not include via connections to an underlying layer. In arrangement 124 of FIG. 9a, the lower end of conductor on the left is not connected to any other structure, while that of the conductor on the right is connected to the input of the memory cell associated with the program structure. In arrangement 126 of FIG. 9b, the relative positions of the memory cell input conductor and the unconnected conductor are reversed. Selection between arrangements 124 and 126 may therefore also be used to determine the voltage applied to the memory cell. If the lowermost layer of the programming structure is a doped layer within the substrate, the connections to the memory cell input may involve, for example, making contact back up to the polysilicon layer of the circuit. Path arrangements such as those of FIG. 9 may also be adapted in a manner similar to that for arrangements 95 and 99 of FIG. 7 when the lowermost layer is a doped, or diffusion, layer.

The path arrangements and via positions described above and shown in FIGS. 3–9 are merely exemplary, and other suitable arrangements and positions are possible. A general attribute of a programming structure described herein is that each of the possible programming voltages is present on each of multiple layers within the structure, so that the voltage used to program the memory cell may be changed using as few as a single mask. Arrangements in which one of the alternate paths "wraps around" an end of the other are believed to be advantageous in allowing the relative lateral positions of the programming voltages to be altered. This can be seen in arrangement 81 in the way that conductor 86 surrounds the end of conductor 80 containing via region 84, and in arrangement 93 in the way that conductor 92 surrounds the end of conductor 94 containing via region 102. Arrangements without such wrapping around of conductors may be possible in some embodiments, however. The arrangement of possible via locations into vertical rows, as can be seen in FIG. 6 for arrangements 81 and 93, is also believed to be advantageous in providing symmetry to allow stacking and/or rotating of the path arrangements, but configurations without this type of via location arrangement may also be suitable. Although a single contact or via connecting each end of a conductor to the layer above or below is shown herein, multiple contacts or vias could be used in some embodiments.

The above-described examples are for programming of a memory cell using two programming voltages. The concept could also be adapted for use with multi-valued logic, in which multiple programming voltages are used to program a corresponding number of states of the memory cell. In order for any of the programming voltages to be achieved by changing a single masking layer, however, path arrangements and via positions allowing each possible position for each of the multiple programming voltages would be needed. If a set of three programming voltages is considered, it can be determined that there are six ways in which the voltages may be arranged into relative lateral positions (e.g., left, center and right positions). However, it is not necessary to implement a full set of the six possible ordering transformations, since the ability to connect any of the three voltages to the input of the memory cell is all that is needed. In other words, when the desired one of the voltages is routed to the input, the relative lateral positions of the other two voltages are irrelevant, and it is not necessary to maintain the ability to generate every possible combination. Therefore, any subgroup of the positional arrangements which still allows connection of each of the voltages to each of the three lateral positions is sufficient. In particular, the cyclic subgroup of shift operations ABC→BCA→CAB→ABC provides us with an appropriate subgroup of the full set of six. A set of three path arrangements, each containing three distinct alternate paths, is therefore needed to provide the option of each different lateral position configuration for a given set of via positions. Furthermore, if the programming voltage is to be alterable by using a single via layer mask, each of the path arrangements must have three alternate via positions for vias coming from one direction (above or below), each of the alternates providing one of the three lateral position configurations. Three corresponding positions for vias coming from the other direction are also needed. Nevertheless, the set of path arrangements and via positions needed to implement the programming structure for multi-valued logic does become more complex and area-consuming. It can be determined that for n possible programming voltages, n alternate path arrangements and via positions are needed, since the cyclic subgroup of n elements always has n members.

A possible implementation of this scheme for three programming voltages is shown in FIG. 10. FIG. 10a shows a first path arrangement option, FIG. 10b a second option, and FIG. 10c a third option. For each of the path arrangement options, contact/via positions 121, 123, and 125 (or rows 1, 2, and 3) may be chosen between in order to select the relative lateral positions of the three voltages. Contact/via positions 121, 123, and 125 are possible positions for vias connecting to a layer below that of the path arrangement, while positions 127, 129, and 131 are possible positions for vias connecting to a layer above the path arrangement. A user wishing to increment the voltage by one (i.e., change from the voltage passed down to the layer in lateral position #1 to the voltage passed down in lateral position #2—the actual strengths are of course arbitrary, as is the ordering from 'lowest' to 'highest') will simply increment the option used by one (if a horizontal conductive layer is undergoing a change), or else increment the row by one (if a contact or via layer is undergoing a change). When the option or row in current use is #3, then the user replaces the current option or row used with #1. Decrementing the voltage is accomplished by decrementing the option or row number in a similar way, and if the row or option used is already #1, then that row or option must be changed to #3.

The programming structure shown in the view of FIG. 2 connects a programming voltage to the input of a single memory cell. In practice, the programming structure would typically contain multiple signal paths, each path used to program a respective memory cell. In this way, a multi-bit circuit ID could be programmed, for example. In a preferred embodiment, the signal path for each memory cell is formed from a separate stack of path configurations connected by vias as discussed above. In the most flexible embodiment, each mask level within the programming structure includes a selected path arrangement or via position for each bit to be programmed. In this way, any bit could be altered at any mask level. In some embodiments, however, it may not be necessary to have the ability to alter every bit at every level. In order to facilitate identification of mask levels by reading of the circuit ID, a particular mask level may be "assigned" to one or more specific bits, where altering of the mask is to be accompanied by altering only the assigned bit or bits of the ID. In such an embodiment, the ability to alter bits other than the assigned bits may not be necessary on a given mask level. The possibly complex path arrangements needed to provide the alteration ability may therefore not be needed on this mask for every bit. In this situation, the path arrangements for bits that the mask does not need to change could be replaced with simplified path arrangements which simply pass the programming voltages to the next level without altering their positions.

Figure 11A:
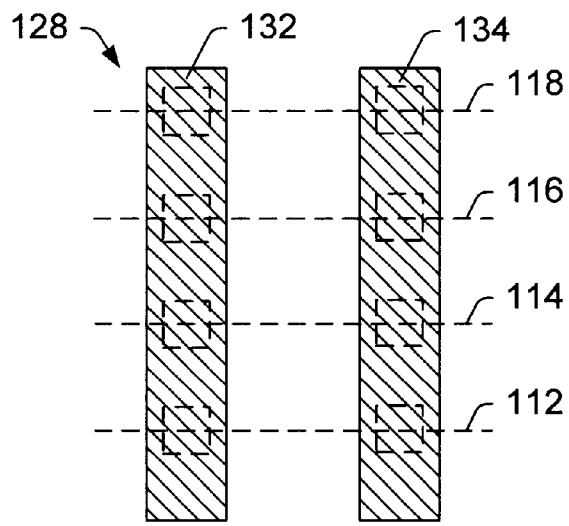
FIG. 11a is a top view of a path arrangement for use in a layer within which no alteration of the memory cell programming is desired.
Figure 11B:
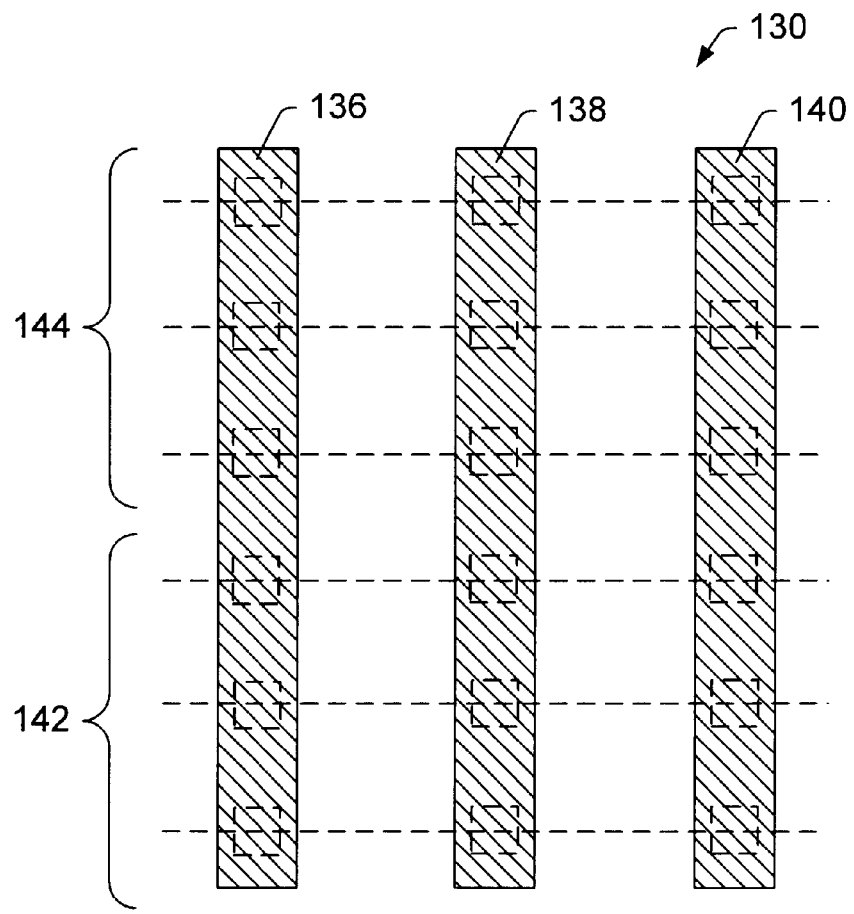
FIG. 11b is a top view of a path arrangement providing no alteration of the memory cell programming, for a programming structure in which three programming voltages are used.

Examples of simplified path arrangements which do not alter the positions of the programming voltages are shown in FIG. 11. Path arrangement 128 of FIG. 11a is suitable for use in a stack with two-voltage path arrangements such as those of FIGS. 3–9. In the same manner as described above for FIG. 6, via positions 112 and 114 are for vias connecting to conductors 132 and 134 from below, and positions 116 and 118 are for vias connecting from above. As also discussed above, this convention could be reversed. Arrangement 128 simply connects each of the conductive paths in the layer above it to the corresponding paths in the layer below, without providing any alteration of the relative lateral positions of the programming voltages. No choice of via positions from above or from below will alter the programming voltage positions. For bits which do not need to be changed by a particular horizontally conductive layer mask, or by an adjacent via mask, however, arrangement 128 may provide a simplified structure by which the programming voltages can be passed on to other masking layers at which the bit programming may be altered. Use of the simplified path arrangement for appropriate bits may save some area on the mask, and also reduce the pattern complexity of the mask, possibly reducing the potential for errors in mask or IC production. A similar simplified path arrangement for use with three programming voltages is shown in FIG. 11b. Path arrangement 130 is similar to arrangement 128 except that it contains three conductive paths (one for each voltage), three possible via positions 142 for vias from below, and three positions 144 for vias from above. Particularly in the case of multivalued logic, use of the simplified arrangement may save mask area and complexity as compared to the path arrangements needed to provide the ability to alter programming of a bit.

It may be advantageous to retain the ability to change all bits, however. In one preferred embodiment, when two mask reticles must be changed, it is possible to alter some of the equivalent bits on both reticles, so that while those bits of the device ID would normally be unchanged (even though the old and new IDs are still distinguishable), those bits will change if one of the old reticles is inadvertently substituted for the corresponding new reticle. In general, whenever more than one mask layer must be changed, the designer may find it advantageous to make some changes in the parity matrix on every one of those changed mask layers, to facilitate the detection of just this sort of reticle error.

Figure 12:
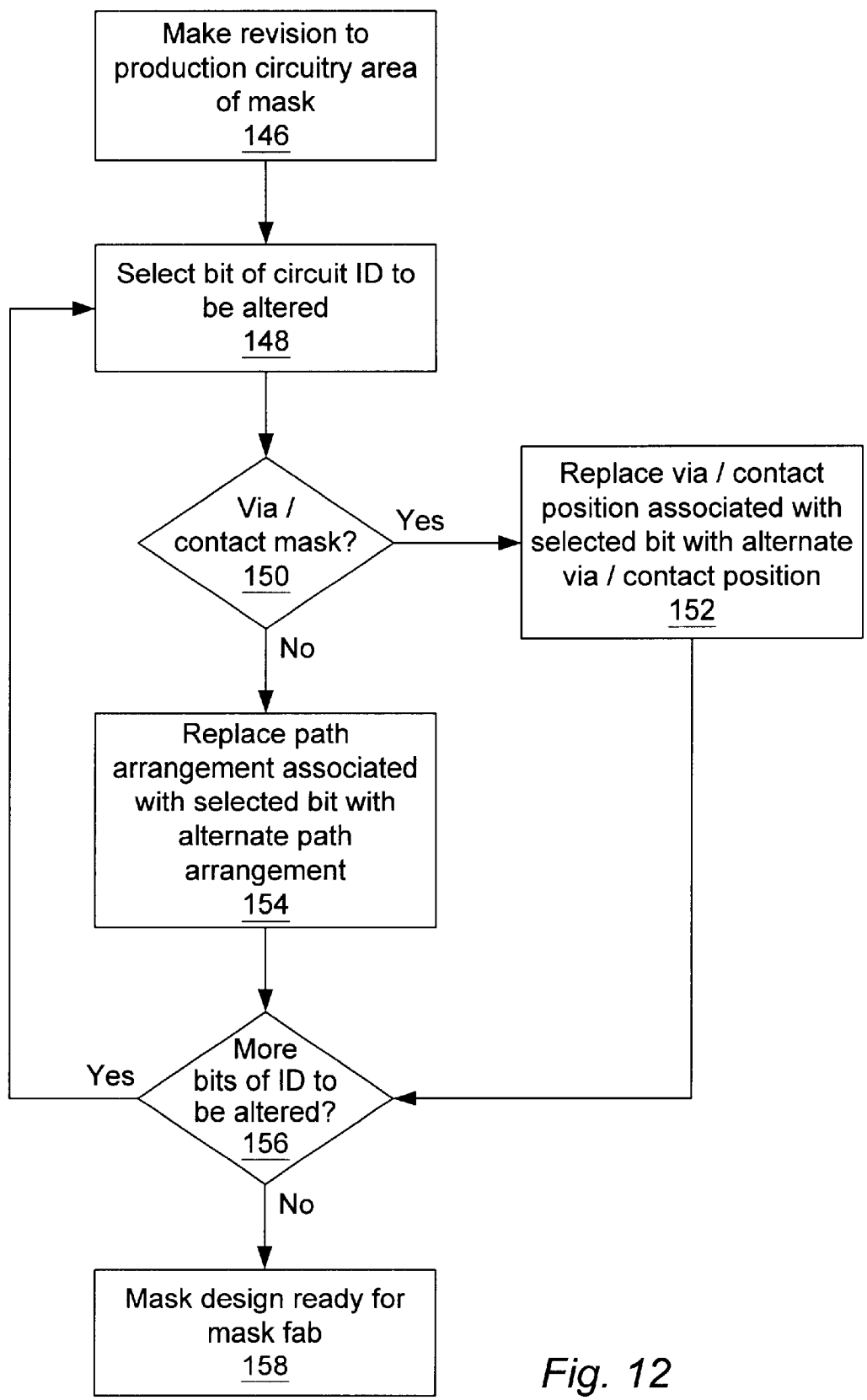
FIG. 12 is a flow diagram illustrating an embodiment of a method for designing a mask which incorporates a revision to the production circuitry fabrication and a change of the circuit ID.

An embodiment of a method for forming a mask using the programming structure concepts described herein is illustrated by the flow diagram of FIG. 12. The method of FIG. 12 is directed to making a revision of an existing mask, but is also generally applicable to an original design of a mask for fabrication of a circuit having a particular device ID. In the embodiment of FIG. 12, a revision is made to the area of the mask used to fabricate production circuitry of the integrated circuit (box 146 of the flow diagram). Such a revision may result from, for example, a design change or a modification based on testing results. In view of the revision, it is desirable to alter the circuit ID of the integrated circuit. A bit within the circuit ID to be altered is therefore selected (box 148). This selection may in some embodiments involve pre-assigning a certain bit or bits to a particular mask.

If the mask is a via/contact mask ("yes" branch of decision box 150), the via/contact position associated with the selected bit which was previously used in the mask design is replaced with an alternate via/contact position (box 152). The alternate via/contact position is effective to alter the programmed bit, in combination with the path arrangements and via positions used on other levels of the programming structure. If, on the other hand, the mask is not a contact/via mask and is therefore a mask for a horizontally conductive layer ("no" branch of box 150), the previously used arrangement of conductive paths is replaced with an alternate path arrangement (box 154). If there are more bits of the circuit ID to be altered (box 156), the process is repeated for the next bit. Otherwise, the mask design is ready for fabrication of the mask. Replacement of the via/contact position or path arrangement, as appropriate, may involve selecting a position or arrangement from a set of multiple mask patterns held on a storage medium or carrier medium associated with the equipment used to design and/or fabricate the mask.

Figure 13A:
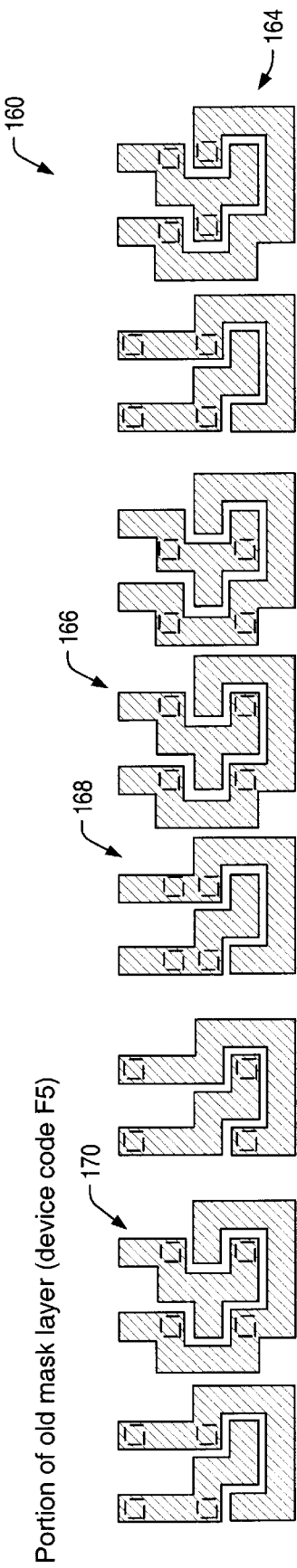
FIG. 13a shows a section of a horizontally conductive mask layer including programming structure portions associated with eight bits of a device ID.
Figure 13B:
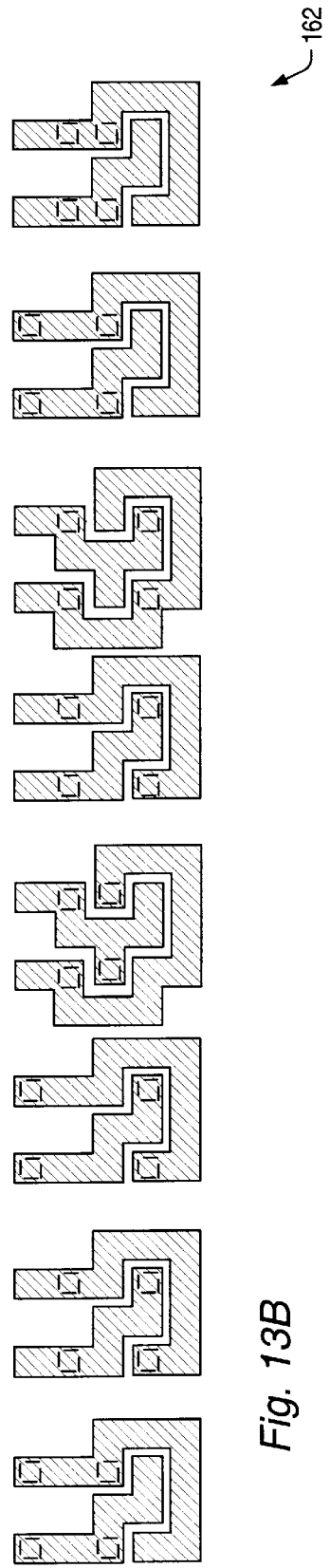
FIG. 13b shows an alternative section of the mask layer which may be substituted for that of FIG. 13a in order to change the device ID from the hexadecimal number F5 to the hexadecimal number AC.

As a further demonstration of the use of path arrangement selection in altering a circuit's identification code, an exemplary set 160 of path arrangements for programming eight bits of an identification code is shown in FIG. 13a. In combination with all of the other layers (not shown) of the programming structure, this set of path arrangements results in a particular eight-bit code being programmed into a memory device or register. As an example, assume that the code is hexadecimal "F5", or binary "11110101". A replacement set 162 of path arrangements for changing the code from "F5" to "AC" is shown in FIG. 13b. Because the desired code "AC" is binary "10101100," the bits needing to be changed (from the right) are the first, the fourth, the fifth, and the seventh. Therefore, only the first (arrangement 164), fourth (arrangement 166), fifth (arrangement 168) and seventh (arrangement 170) path arrangements from the right in FIG. 13a are replaced with alternate path arrangements in FIG. 13b. In this way, the identification code can be changed from "F5" to "AC" by making changes to only one mask layer.

It will be appreciated by those skilled in the art having the benefit of this disclosure that this invention is believed to provide methods, structures and carrier media associated with programming a memory cell within an integrated circuit. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A structure for programming a memory cell on an integrated circuit, said structure comprising a conductive signal path extending, through multiple horizontally conductive layers of the integrated circuit, from a programming voltage node to an input of the memory cell, wherein the signal path includes portions selected from multiple alternate path portions formed within each of the multiple horizontally conductive layers, and wherein each of the horizontally conductive layers includes two alternative path portions, and each of the alternative path portions is connected to a respective programming voltage that includes an upper polarity of the integrated circuit's power supply and a lower polarity of the power supply.

2. The structure of claim 1, wherein the signal path portions are selected through positions of conductive vias or contacts formed within insulating layers interposed between the multiple horizontally conductive layers.

3. The structure of claim 1, wherein the memory cell is within a circuit identification register on the integrated circuit, and is adapted to store a bit of a circuit identification code stored within the register.

4. The structure of claim 3, wherein a value of the respective bit is responsive to a change of a selected alternate path portion using any of the masks used to fabricate the conductive layers and insulating layers.

5. The structure of claim 3, further comprising additional conductive paths extending to inputs of respective additional memory cells within the register.

6. The structure of claim 1, wherein the signal path portions within a first horizontally conductive layer are selected such that relative lateral positions of the respective programming voltages carried by contacts to the path portions from below are unchanged with respect to relative lateral positions of the programming voltages carried by contacts to the path portions from above.

7. The structure of claim 1, wherein the signal path portions within a first horizontally conductive layer are selected such that relative lateral positions of the respective programming voltages carried by contacts to the path portions from below are altered with respect to relative lateral positions of the programming voltages carried by contacts to the path portions from above.

8. The structure of claim 1, wherein the multiple alternate path portions comprises two alternate path portions, and wherein one of the alternate path portions is shaped to surround an end of the other alternate path portion.

9. The structure of claim 1, wherein the horizontally conductive layers comprise an interconnect layer.

10. The structure of claim 1, wherein the horizontally conductive layers comprise a polysilicon layer.

11. The structure of claim 1, wherein the horizontally conductive layers comprise a semiconductor layer having patterned doped portions.

12. A method for identifying one or more masks used in the manufacture of an integrated circuit, said method comprising:

reading a circuit identification code stored in a nonvolatile circuit identification register on the integrated circuit; and comparing a read value of one or more bits within the circuit identification code to a design value of the one or more bits, wherein the design value is affected by a configuration of a programming structure formed using the one or more masks, and wherein said comparing further comprises determining a variation in the read circuit identification code from one revision of the integrated circuit to another, and wherein said design value comprises an alteration of the one or more bits from the one revision to the other.

13. A method of designing a mask for fabrication of an integrated circuit, said method comprising selecting one of multiple configurations of a programming structure portion to be formed using the mask, wherein the programming structure portion is adapted to pass multiple programming voltages from one layer of the integrated circuit to an adjacent layer, and wherein the programming voltages are adapted to program a memory cell within the integrated circuit.

14. The method of claim 13, wherein the mask is adapted to pattern a horizontally conductive layer, the programming structure portion comprises an alternate path portion for each of the multiple programming voltages, and said selecting comprises selecting between alternative arrangements of the multiple alternate path portions.

15. The method of claim 14, wherein each of the alternate path portions is adapted for connection within the subsequently formed circuit to a pad or node carrying its respective programming voltage.

16. The method of claim 15, wherein said selecting comprises selecting an arrangement of the alternate path portions such that relative lateral positions of the respective programming voltages carried by contacts to the path portions from below are unchanged with respect to relative lateral positions of the programming voltages carried by contacts to the path portions from above.

17. The method of claim 15, wherein said selecting comprises selecting an arrangement of the alternate path portions such that relative lateral positions of the respective programming voltages carried by contacts to the path portions from below are altered with respect to relative lateral positions of the programming voltages carried by contacts to the path portions from above.

18. The method of claim 13, wherein the mask is adapted for patterning of a dielectric layer, wherein the programming structure portion comprises multiple conductive vias or contacts, and wherein said selecting comprises selecting positions of the via or contact openings.

19. The method of claim 13, wherein the programming structure portion is adapted to pass n programming voltages, and said selecting comprises selecting between n available configurations.

20. The method of claim 13, wherein the memory cell is within a circuit identification register on the integrated circuit, and is adapted to store a bit of a circuit identification code stored within the register.

21. A computer-usable carrier medium, comprising digital representations of a set of mask patterns for integrated circuit fabrication, wherein the set of mask patterns includes multiple alternative configurations of a programming structure pattern adapted for placement on a mask, wherein the programming structure pattern is adapted for formation of a programming structure portion within a corresponding layer of a fabricated integrated circuit, wherein the programming structure portion is adapted to pass multiple programming voltages from one layer of the integrated circuit to an adjacent layer, and wherein the programming voltages are adapted to program a memory cell within the integrated circuit.

22. The carrier medium of claim 21, wherein the alternative configurations comprise alternative arrangements of multiple conductive path portions, wherein each conductive path portion is adapted to pass a respective programming voltage.

23. The carrier medium of claim 21, wherein the alternative configurations comprise positions of a set of contact or via openings.

24. The carrier medium of claim 21, wherein the digital representations comprise program instructions.

25. The carrier medium of claim 21, wherein the digital representations comprise data points.

26. A structure for programming a memory cell on an integrated circuit, said structure comprising a conductive signal path extending, through multiple horizontally conductive layers of the integrated circuit, from a programming voltage node to an input of the memory cell, wherein the signal path includes portions selected from multiple alternate path portions formed within each of the multiple horizontally conductive layers, wherein the signal path portions are selected through positions of conductive vias or contacts formed within insulating layers interposed between the multiple horizontally conductive layers.

27. The structure of claim 26, wherein the memory cell is within a circuit identification register on the integrated circuit, and is adapted to store a bit of a circuit identification code stored within the register.

28. The structure of claim 27, wherein a value of the respective bit is responsive to a change of a selected alternate path portion using any of the masks used to fabricate the conductive layers and insulating layers.

29. The structure of claim 27, further comprising additional conductive paths extending to inputs of respective additional memory cells within the register.

30. The structure of claim 26, wherein the signal path portions within a first horizontally conductive layer are selected such that relative lateral positions of the respective programming voltages carried by contacts to the path portions from below are unchanged with respect to relative lateral positions of the programming voltages carried by contacts to the path portions from above.

31. The structure of claim 26, wherein the signal path portions within a first horizontally conductive layer are selected such that relative lateral positions of the respective programming voltages carried by contacts to the path portions from below are altered with respect to relative lateral positions of the programming voltages carried by contacts to the path portions from above.

32. The structure of claim 26, wherein the multiple alternate path portions comprises two alternate path portions, and wherein one of the alternate path portions is shaped to surround an end of the other alternate path portion.

33. The structure of claim 26, wherein the horizontally conductive layers comprise an interconnect layer.

34. The structure of claim 26, wherein the horizontally conductive layers comprise a polysilicon layer.

35. The structure of claim 26, wherein the horizontally conductive layers comprise a semiconductor layer having patterned doped portions.

* * * * *